(12) United States Patent
von Ammon et al.

(10) Patent No.: US 7,470,323 B2
(45) Date of Patent: Dec. 30, 2008

(54) PROCESS FOR PRODUCING P-DOPED AND EPITAXIALLY COATED SEMICONDUCTOR WAFERS FROM SILICON

(75) Inventors: Wilfried von Ammon, Hochburg/Ach (AT); Katsuhiko Nakai, Hikari Yamaguchi (JP); Martin Weber, Kastl (DE); Herbert Schmidt, Halsbach (DE); Atsushi Ikari, Yamaguchi (JP)

(73) Assignee: Siltronic AG, Munich (DE)

( * ) Notice: Subject to any disclaimer, the term of this patent is extended or adjusted under 35 U.S.C. 154(b) by 0 days.

(21) Appl. No.: 11/870,565

(22) Filed: Oct. 11, 2007

(65) Prior Publication Data

US 2008/0096371 A1 Apr. 24, 2008

(30) Foreign Application Priority Data

Oct. 18, 2006 (DE) .................. 10 2006 049 231

(51) Int. Cl.
*C30B 15/20* (2006.01)

(52) U.S. Cl. ................ 117/19; 117/13; 117/20

(58) Field of Classification Search .......... 117/13, 117/19, 20
See application file for complete search history.

(56) References Cited

U.S. PATENT DOCUMENTS

| 6,162,708 A | 12/2000 | Tamatsuka et al. |
| 6,641,888 B2 | 11/2003 | Asayama et al. |
| 6,843,848 B2 | 1/2005 | von Ammon et al. |
| 2006/0225639 A1 | 10/2006 | Ono et al. |
| 2006/0225640 A1 | 10/2006 | Ono et al. |

FOREIGN PATENT DOCUMENTS

| EP | 1136596 A1 | 9/2001 |
| EP | 1143045 A1 | 10/2001 |
| EP | 1598452 A1 | 11/2005 |

*Primary Examiner*—Felisa C Hiteshew
(74) *Attorney, Agent, or Firm*—Brooks Kushman P.C.

(57) ABSTRACT

The Czochralski method is used for producing p⁻-doped and epitaxially coated semiconductor wafers from silicon, wherein a silicon single crystal is pulled, and during the pulling is doped with boron, hydrogen and nitrogen, and the single crystal thus obtained is processed to form p⁻-doped semiconductor wafers which are epitaxially coated.

20 Claims, 5 Drawing Sheets

OSF density
([N] = 1.2 x 10E14 /cm³)
(Without hydrogen doping)

OSF density
([N] = 1.3 x 10E15 /cm³)
(Without hydrogen doping)

OSF density
([N] = 1.2 x 10E14 /cm³)
(With hydrogen doping)

OSF density
([N] = 1.3 x 10E15 /cm³)
(With hydrogen doping)

BMD density
([N]=1.2 x 10E14 /cm³)
(Without hydrogen doping)

BMD density
([N]=1.3 x 10E15 /cm³)
(Without hydrogen doping)

BMD density
([N]=1.2 x 10E14 /cm³)
(With hydrogen doping)

BMD density
([N]=1.3 x 10E15 /cm³)
(With hydrogen doping)

Layer defects
([N]=1.2 x 10E14 /cm³)
(With hydrogen doping)

Layer defects
([N]=1.3 x 10E15 /cm³)
(With hydrogen doping)

PROCESS FOR PRODUCING P-DOPED AND EPITAXIALLY COATED SEMICONDUCTOR WAFERS FROM SILICON

BACKGROUND OF THE INVENTION

1. Field of the Invention

The invention relates to a process for producing epitaxially coated semiconductor wafers from silicon, known as epi wafers. Specifically, the invention relates to the production of $p^-$-doped and epitaxially coated semiconductor wafers from silicon, which are distinguished by a high getter capacity and by a low number of layer defects and are therefore eminently suitable for further processing to form large scale integrated electronic components.

2. Description of the Related Art

Unlike the case of heavily boron-doped, $p^+$-doped semiconductor wafers, the ability to keep metallic impurities away from the electrically active region is inadequate in the case of lightly boron-doped, $p^-$-doped semiconductor wafers. In general, such wafers form insufficient oxygen precipitates (BMDs, bulk micro defects) which ordinarily bond such impurities and in this way act as what are known as intrinsic getters. In the case of lightly boron-doped semiconductor wafers made from silicon, nucleation centers for oxygen precipitates are destroyed to such an extent during epitaxial coating that the resulting $p^-$-doped epi wafers no longer have a sufficient getter capacity, which is assumed to require a density of at least $5 \times 10^8$ cm$^{-3}$ oxygen precipitates.

It is known that the formation of nucleation centers for oxygen precipitates and ultimately also the getter capacity can be increased if the semiconductor wafers are additionally doped with nitrogen and/or carbon. The nitrogen added by doping has the effect of making the nucleation centers more stable at higher temperatures, including the temperatures used during epitaxial coating. On the other hand, however, nitrogen also promotes the formation of oxidation-induced stacking faults (OSFs) in a region of the semiconductor wafer known as the OSF ring. Consequently, increased levels of layer defects also occur in this region on the surface of an epitaxially deposited layer, which can have a highly adverse effect on the functionality of electronic components and should therefore be avoided as far as possible. Layer defects (LPDs, light point defects) of this type are rendered visible by optical methods using scattered laser light.

It is proposed in EP 1 143 045 A1 to restrict the nitrogen concentration to a low range of from $2 \times 10^{13}$ cm$^{-3}$ to $1 \times 10^{14}$ cm$^{-3}$ and to carry out epitaxial coating only on semiconductor wafers made from silicon which, with regard to point defects, have a void-rich region (v-region) with or without an OSF ring over the entire wafer surface. This method has the drawback that the required boundary conditions entail increased outlay in terms of monitoring and time when pulling the single crystal. For example, the cooling rate has to be kept low in the range from 1000 to 900° C., in order to alter the morphology of the OSF nuclei. A low cooling rate generally requires the single crystal to be pulled at a low and therefore uneconomical pulling rate. A further particular drawback is that the segregation-related rise in nitrogen concentration is at odds with the efforts to limit the nitrogen concentration. The nitrogen concentration rises greatly as the length of the single crystal increases, and consequently can quickly move out of the restricted range. Layer defects may then still be avoidable if the oxygen concentration is kept at a low level. However, this likewise requires increased monitoring outlay and in turn gives rise to the problem that it is possible that insufficient oxygen may be present to form sufficient numbers of nucleation centers for oxygen precipitates.

SUMMARY OF THE INVENTION

Therefore, an object of the present invention is to provide a process which is subject to considerably fewer restrictions for the manufacture of lightly p-doped silicon wafers. The invention relates to a process for producing $p^-$-doped and epitaxially coated semiconductor wafers from silicon, wherein a silicon single crystal is pulled using the Czochralski method and during this pulling is doped with boron, hydrogen and nitrogen, and is processed to form $p^-$-doped semiconductor wafers which are epitaxially coated. The epi wafers produced in this way are particularly suitable for further processing to form large scale integrated electronic components, on account of their getter capacity and low layer defect densities.

DETAILED DESCRIPTION OF PREFERRED EMBODIMENT(S)

Figure 1:
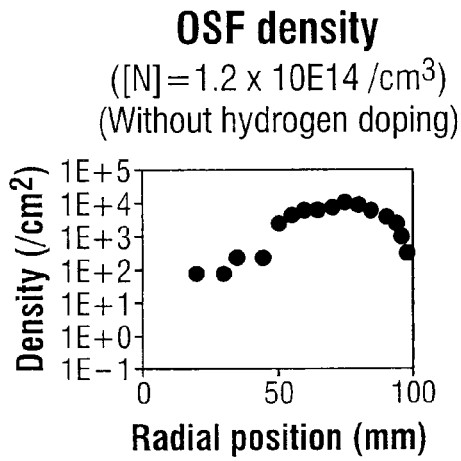
FIGS. 1-4 are the OSF densities of wafers produced with and without hydrogen doping.

It has now been surprisingly discovered that hydrogen considerably attenuates the action of nitrogen with regard to promoting formation of oxidation-induced stacking faults. As a result, there is considerably more room to maneuver to stimulate the number of nucleation centers for oxygen precipitates by doping with nitrogen without at the same time generating OSFs in the substrate wafer and thereby causing a rise in layer defects on the epi wafer. Epi wafers produced in accordance with the invention have a sufficient number of nucleation centers for oxygen precipitates yet nevertheless have scarcely any layer defects. By using the v/G law, it is preferable to produce a single crystal which provides semiconductor wafers which do not have any agglomerates of silicon interstitials. According to the v/G law, suitable control of the quotient formed from the pulling rate v and the axial temperature gradient G at the crystallization boundary during the pulling of the single crystal is sufficient to control the radial distribution of point defects and agglomerates thereof on the semiconductor wafer.

Neither the $p^-$-doped semiconductor wafers made from silicon nor the epi wafers obtained therefrom by epitaxial coating require a special heat treatment at temperatures of 1000° C. or above, during which the nucleation centers can grow to form oxygen precipitates with a getter capacity. Rather, this process takes place during the production of the components, specifically even if, as in the case of the production of the most recent generation of components, only brief heat treatments at relatively low temperatures of below 1000° C. are envisaged.

According to the invention, the $p^-$-doped semiconductor wafers made from silicon are produced by pulling a silicon single crystal using the Czochralski method and doping it with boron, hydrogen and nitrogen while it is being pulled.

Simultaneous doping of silicon wafers with hydrogen and nitrogen is described for example in EP 1 136 596 A1, but no treatment of p⁻-doped wafers, nor the beneficial results obtained thereby, are disclosed. Since hydrogen tends to form micro-bubbles in silicon if it is present in relatively high concentrations, it should be ensured that the concentration required for the formation of micro-bubbles is not reached. This can be reliably achieved by the single crystal being pulled at a hydrogen partial pressure of less than 3 mbar. With regard to the effect of hydrogen of suppressing the formation of layer defects, it is preferable if the hydrogen partial pressure during the pulling of the single crystal is in a range from 0.2 to 2.5 mbar.

With regard to the nitrogen doping, a nitrogen concentration of $1\times10^{15}$ cm$^{-3}$ should be considered the upper limit. If the nitrogen concentration is above this level, it is also no longer possible, by additional doping with hydrogen, to prevent the epi wafers produced from having numerous layer defects in the region of the OSF ring. The preferred range for the nitrogen concentration is greater than $1\times10^{14}$ cm$^{-3}$ and less than $1\times10^{15}$ cm$^{-3}$. If the nitrogen concentration is lower than this range, insufficient nucleation centers for oxygen precipitates are formed, in particular if sufficient oxygen is not present in the single crystal. Conversely, even if the nitrogen concentration is low, too many layer defects may be formed if the oxygen concentration in the semiconductor wafer to be coated is too high. It is therefore most preferable for the oxygen concentration also to be taken into account, by reacting to the segregation-induced increase in the nitrogen concentration during pulling of the single crystal by a controlled reduction in the oxygen concentration. The oxygen concentration in the single crystal should no longer exceed a level of $6\times10^{17}$ cm$^{-3}$, preferably $5.5\times10^{17}$ cm$^{-3}$, if the nitrogen concentration, for segregation reasons, has risen to $1\times10^{15}$ cm$^{-3}$. During pulling using the Czochralski method, a single crystal usually takes up less oxygen as its length increases, since on account of the decrease in the quantity of melt, less oxygen passes into the melt via the crucible wall. Furthermore, there are various options available for reducing the oxygen concentration in a controlled way, which can be combined with one another as desired. For example, the oxygen concentration in the single crystal drops if the strength of a magnetic field is increased, thereby attenuating convection currents in the melt. A similar effect is achieved if the rotational speed of the crucible is reduced, if the gas pressure in the pulling installation is reduced or if the flow rate of a gas passed through the pulling installation and over the crucible is increased.

The single crystal produced using the Czochralski method and doped with boron, hydrogen and nitrogen is divided into wafers. This is preferably done with the aid of a wire saw, since it is in this way possible to produce a large number of semiconductor wafers in a single operation. These silicon semiconductor wafers, preferably having a diameter of 200 mm or 300 mm, contain boron in a concentration of $1\times10^{17}$ cm$^{-3}$ to $1\times10^{13}$ cm$^{-3}$, which corresponds to p⁻-type doping. They are then subjected to standard processing steps with a view to eliminating mechanical damage and creating flat and parallel side faces and smooth edges. These steps include machining by lapping and/or grinding the side faces, treatment with an etchant, polishing at least one of the two side faces, and rounding and polishing the edge. A thin film of silicon is deposited epitaxially on a polished side face. The thickness of the epitaxial film is preferably 1 to 5 μm. The epitaxial film contains a p-type dopant, preferably boron, which means that it is also possible to refer to a p/p⁻-doped epi wafer. The boron concentration is preferably from $2\times10^{16}$ to $1\times10^{15}$ cm$^{-3}$.

The epi wafers can form a large number of oxygen precipitates in the thickness beneath the epitaxial layer, corresponding to the bulk of the semiconductor wafer prior to coating, which imparts a sufficient getter capacity. The concentration of the BMDs formed is at least $5\times10^{8}$ cm$^{-3}$, preferably $10^{9}$ to $10^{10}$ cm$^{-3}$. The number of layer defects is preferably less than 40, referenced on the basis of defects which are larger than 0.09 μm and an area of an epi wafer with a nominal diameter of 200 mm.

The Czochralski method was used to produce p⁻-doped silicon single crystals with a diameter of 200 mm which were processed further to form p⁻-doped semiconductor wafers. For comparison purposes, some of the semiconductor wafers were additionally doped with nitrogen alone, while other semiconductor wafers, in accordance with the invention, were additionally doped with nitrogen and hydrogen in a concentration of approximately $1\times10^{16}$ cm$^{-3}$. The semiconductor wafers were epitaxially coated so as to give p/p⁻-doped epi wafers.

FIGS. 1 to 12 show the results of defect measurements carried out on the p⁻-doped semiconductor wafers (FIG. 1 to 4) and on the p/p⁻-doped epi wafers (FIG. 5 to 12). BMD densities, after a heat treatment conducive to the formation of oxygen precipitates (16 hours at 1000° C.), were measured using an MO-4 laser light scattering measuring instrument produced by Mitsui Mining and Smelting; OSF densities after oxidation in the presence of water vapor at 1100° C., 1 h, were measured using an optical microscope, and layer defect densities were measured using a particle counter SP-1 produced by KLA Tencor. The semiconductor wafers had the same oxygen concentration of $7.2\times10^{17}$ cm$^{-3}$ in accordance with ASTM standard F121-83.

Figure 2:
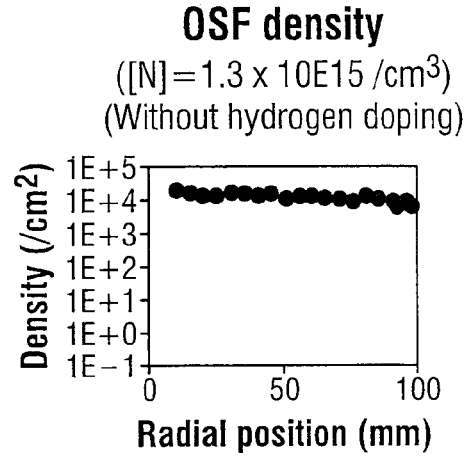

A comparison of the figures shows that when restricted to additional doping with nitrogen (FIGS. 1, 2, 5, 6, 9 and 10), although it is possible to significantly reduce the layer defect densities by lowering the nitrogen concentration from $1.3\times10^{15}$ cm$^{-3}$ (FIGS. 2, 6 and 10) to $1.2\times10^{14}$ cm$^{-3}$ (FIGS. 1, 5 and 9), this reduction is not achieved in a boundary region, in which an OSF ring is formed. If the nitrogen concentration is $1.3\times10^{15}$ cm$^{-3}$, an OSF region extends over the entire wafer surface (FIG. 2). Although the requirements with regard to the BMD density are satisfied (FIG. 6), the requirements relating to the layer defect density are not satisfied.

Figure 9:
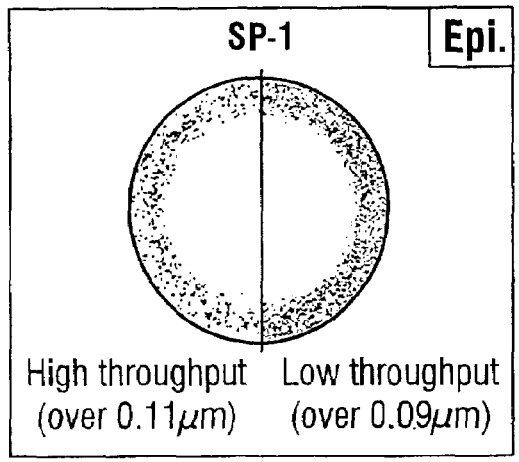
FIGS. 9-12 illustrate large defects in epi wafers where the substrate wafers were produced with and without hydrogen doping.
Figure 10:
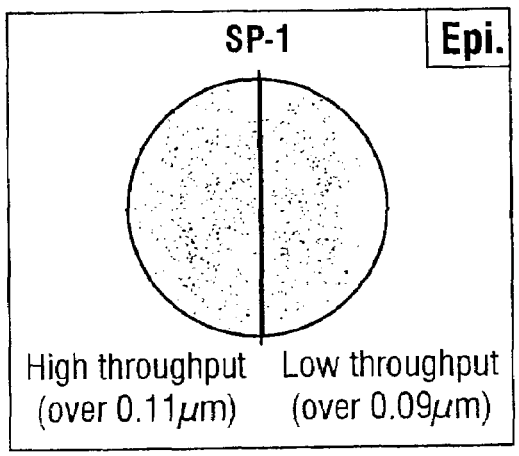

Layer defects are present in large numbers over the entire surface of the epi wafer (FIG. 10). Reducing the nitrogen concentration to $1.2\times10^{14}$ cm$^{-3}$ has the effect of an OSF region remaining only in the boundary region of the wafer (FIG. 1). Although the epi wafer still satisfies the requirements relating to the BMD density (FIG. 5), it no longer meets the requirements relating to the layer defect density. A region corresponding to the OSF region of the semiconductor wafer, with a high number of layer defects, remains in the boundary region (FIG. 9).

Figure 3:
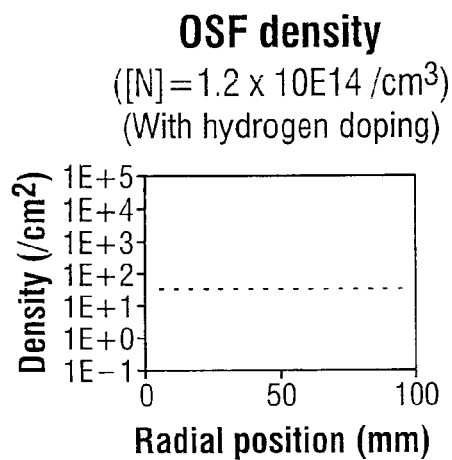
Figure 4:
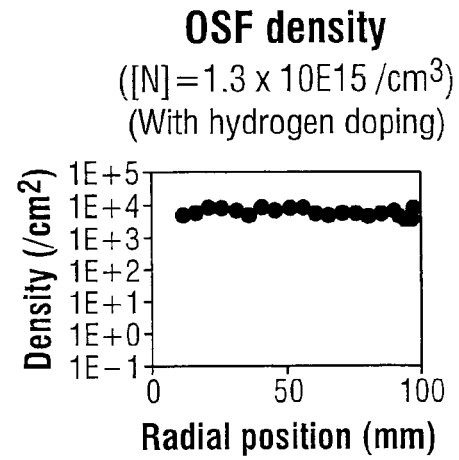
Figure 5:
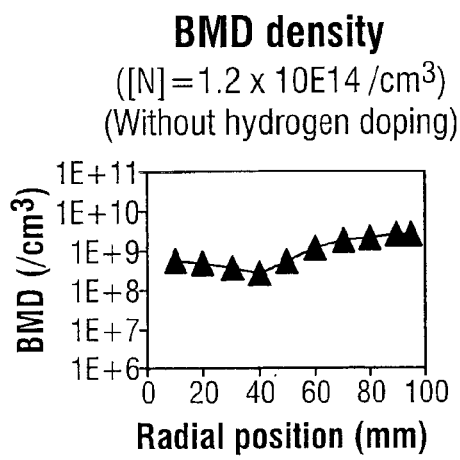
FIGS. 5-8 are BMD densities in p/p$^-$-doped epi wafers from substrate wafers produced with and without hydrogen doping.
Figure 6:
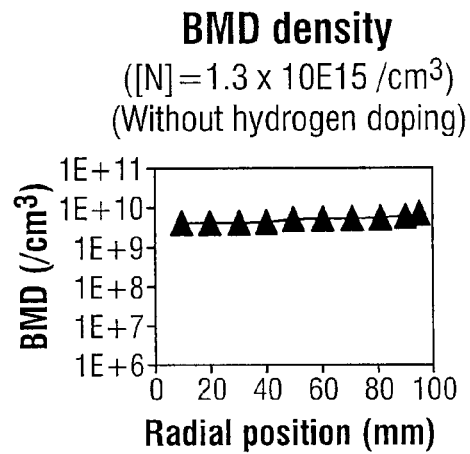
Figure 7:
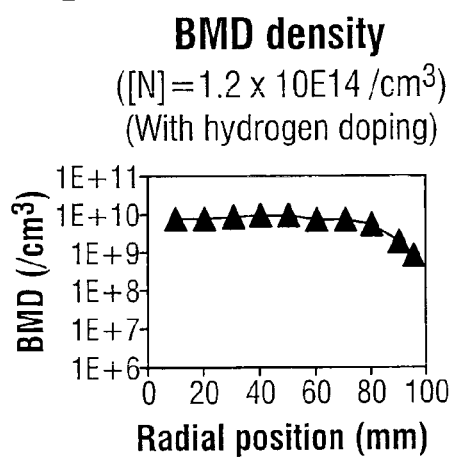
Figure 8:
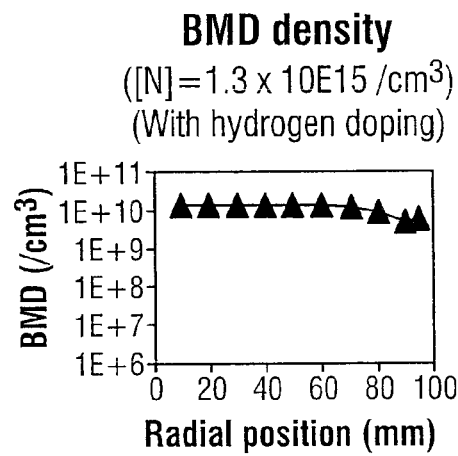
Figure 11:
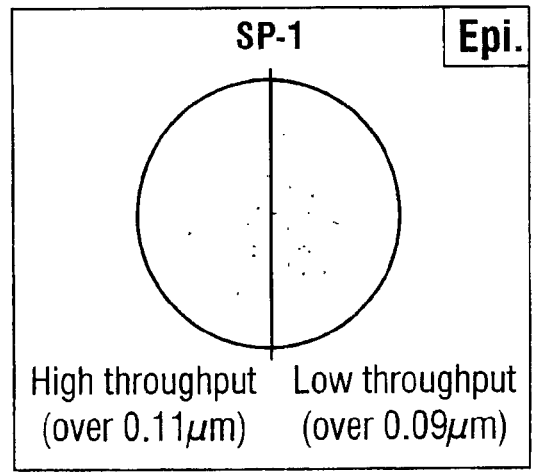
Figure 12:
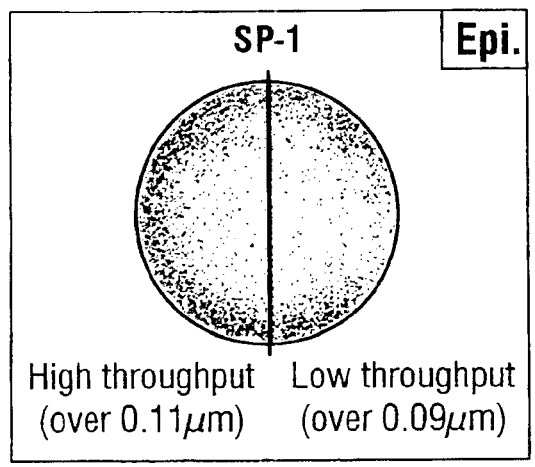

A reduction in the layer defects over the entire surface of the epi wafer can only be achieved if, as prescribed by the present invention, an additional doping with hydrogen has been carried out and the nitrogen concentration has to be reduced to $1.2\times10^{14}$ cm$^{-3}$ (FIGS. 3, 7 and 11). It can be seen from FIGS. 4, 8 and 12 that if the nitrogen concentration is too high, at $1.3\times10^{15}$ cm$^{-3}$, even the additional doping with hydrogen no longer has the desired effect. If the nitrogen concentration is $1.3\times10^{15}$ cm$^{-3}$, the OSF region extends unchanged over the entire wafer surface (FIG. 4). Although the requirements relating to the BMD density are satisfied once again (FIG. 8), the requirements relating to the layer defect density are not. Large numbers of layer defects are present over the entire surface of the epi wafer (FIG. 12). The doping of hydrogen in combination with the reduction in the nitrogen concentration to $1.2 \times 10^{14}$ cm$^{-3}$ has the effect that an OSF region is no longer formed (FIG. 3). Therefore, the detection limit for the OSF density of 30 cm$^{-2}$ is all that is shown in FIG. 3. The epi wafer also satisfies the requirements relating to the BMD density (FIG. 7) and now also the requirements relating to the layer defect density. Only a small number of layer defects (approx. 28 defects larger than 0.09 μm) are found on the epi wafer (FIG. 11).

Figure 13:
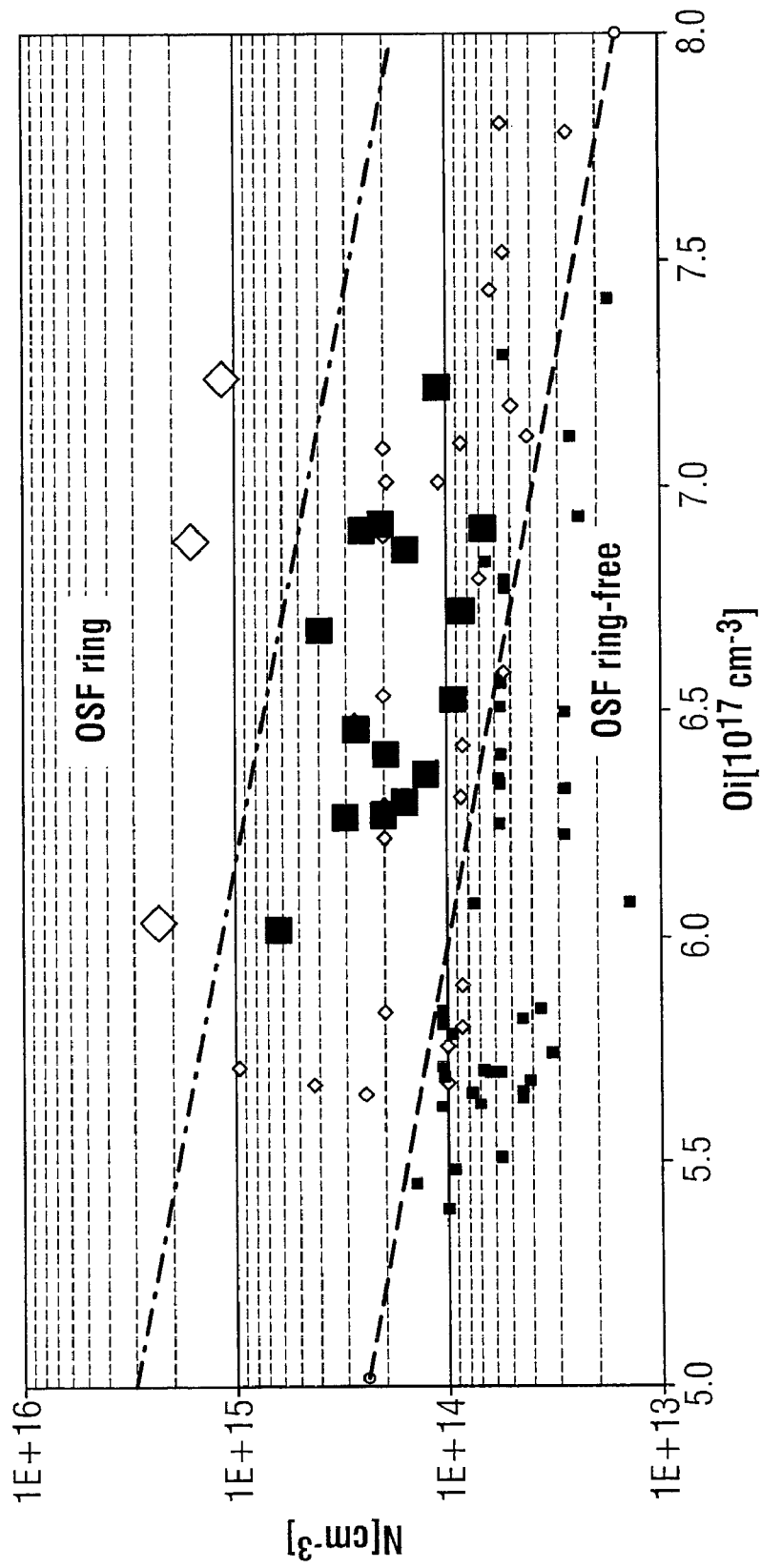
FIG. 13 illustrates the relationship between hydrogen doping and oxygen and nitrogen concentrations.

FIG. 13 shows, for various oxygen and nitrogen concentrations, how additional doping with hydrogen shifts the nitrogen limit concentration. Exceeding this nitrogen limit concentration would lead to the formation of an OSF ring and therefore to an increase in layer defects. By doping with hydrogen at a given oxygen concentration, the nitrogen concentration can be increased by almost an entire order of magnitude, which is of benefit to the formation of stable nucleation centers. The lower boundary line, which represents a best fit line for the data points shown by small symbols, shows the nitrogen limit concentration without additional doping with hydrogen. The upper boundary line, which is a best fit line for the data points shown by larger symbols, shows the effect on the formation of an OSF ring if additional hydrogen doping is used. The boundary lines in each case separate a region below them, in which an OSF ring is not formed and, thus, no epi layer defects are generated, from a region above them, in which an OSF ring is formed and, thus, epi layer defects are generated.

The progress of the present invention is illustrated in FIG. 13. It shows the range of concentration values for the parameters oxygen and nitrogen which guarantees the substantial suppression of OSF defects so that virtually no epi layer defects are generated during the epi process and, at the same time, a sufficient BMD density (greater than $5 \times 10^8$ cm$^{-3}$) for an acceptable gettering capability is provided. The data demonstrate that the control of oxygen and nitrogen concentrations during crystal growth is of great importance as the upper and the lower limit of the allowed nitrogen concentration range is a function of the oxygen concentration. Suitable nitrogen and oxygen concentration pairs are restricted to an area which is limited by an upper boundary concentration and a lower boundary concentration, the upper boundary concentration being calculated by the formula $$C_N = 2715 \times 10^{14} \times \exp(-0.91 \times 10^{17} \times C_O)$$

and the lower boundary concentration being calculated by the formula $$C_N = 235 \times 10^{14} \times \exp(-0.91 \times 10^{17} \times C_O),$$

with $C_O$ and $C_N$ having the dimension [1/cm$^3$].

The oxygen concentration is determined in accordance with the current ASTM version.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for producing an epitaxillay coated p$^-$-doped semiconductor wafer from silicon, comprising:

pulling a silicon single crystal using the Czochralski method and during this pulling, doping the silicon single crystal with boron, hydrogen and nitrogen to form a p$^-$-doped single crystal and controlling a nitrogen concentration $C_n$ in the silicon single crystal in accordance with an oxygen concentration $C_O$; and processing the p$^-$-doped single crystal to form at least one p$^-$-doped semiconductor wafer, and epitaxially coating the p$^-$-doped semiconductor wafer to form an epitaxially coated p$^-$-doped semiconductor wafer.

2. The process of claim 1, wherein the single crystal is pulled under a hydrogen partial pressure of 0.2 to 2.5 mbar.

3. The process of claim 2, wherein the p$^-$-doped semiconductor wafers have a nitrogen concentration of greater $1 \times 10^{14}$ cm$^{-3}$ and less than $1 \times 10^{15}$ cm$^{-3}$.

4. The process of claim 3, wherein an inclusion of oxygen in the p$^-$-doped single crystal is reduced such that the p$^-$-doped single crystal has an oxygen content of $5.5 \times 10^{17}$ cm$^{-3}$ or less.

5. The process of claim 2, wherein an inclusion of oxygen in the p$^-$-doped single crystal is reduced such that the p$^-$-doped single crystal has an oxygen content of $5.5 \times 10^{17}$ cm$^{-3}$ or less.

6. The process of claim 2, wherein the epitaxially coated p$^-$-doped semiconductor wafers are p/p$^-$-doped epi wafers.

7. The process of claim 1, wherein the p$^-$-doped semiconductor wafers have a nitrogen concentration of greater $1 \times 10^{14}$ cm$^{-3}$ and less than $1 \times 10^{15}$ cm$^{-3}$.

8. The process of claim 7, wherein an inclusion of oxygen in the p$^-$-doped single crystal is reduced such that the p$^-$-doped single crystal has an oxygen content of $5.5 \times 10^{17}$ cm$^{-3}$ or less.

9. The process of claim 7, wherein the epitaxially coated p$^-$-doped semiconductor wafers are p/p$^-$-doped epi wafers.

10. The process of claim 1, wherein an inclusion of oxygen in the p$^-$-doped single crystal is reduced such that the p$^-$-doped single crystal has an oxygen content of $6 \times 10^{17}$ cm$^{-3}$ or less.

11. The process of claim 10, wherein the epitaxially coated p$^-$-doped semiconductor wafers are p/p$^-$-doped epi wafers.

12. The process of claim 1, wherein an inclusion of oxygen in the p$^-$-doped single crystal is reduced such that the p$^-$-doped single crystal has an oxygen content of $5.5 \times 10^{17}$ cm$^{-3}$ or less.

13. The process of claim 1, wherein the epitaxially coated p$^-$-doped semiconductor wafers are p/p$^-$-doped epi wafers.

14. The process of claim 1, wherein the nitrogen concentration is controlled so that it is within a region which is limited by an upper boundary concentration and a lower boundary concentration, the upper boundary concentration being calculated by the formula $$C_N = 2715 \times 10^{14} \times \exp(-0.91 \times 10^{17} \times C_O)$$

and the lower boundary concentration being calculated by the formula $$C_N = 235 \times 10^{14} \times \exp(-0.91 \times 10^{17} \times C_O),$$

with $C_O$ and $C_N$ having the dimension [1/cm$^3$].

15. The process of claim 1, wherein a boron concentration in the p$^{31}$-doped silicon single crystal is between $1 \times 10^{17}$ cm$^{-3}$ and $1 \times 10^{13}$ cm$^{-3}$, the p$^-$-doped single crystal is pulled under a hydrogen partial pressure of 0.2 to 2.5 mbar, a nitrogen concentration in the p$^-$-doped single crystal is between $1 \times 10^{14}$ cm$^{-3}$ and $1 \times 10^{15}$ cm$^{-3}$, and the oxygen concentration is less than or equal to $6 \times 10^{17}$ cm$^{-3}$.

16. The process of claim 15, wherein the oxygen concentration is less than or equal to $5.5 \times 10^{17}$ cm$^{-3}$.

17. The process of claim 1, wherein the p$^-$-doped semiconductor wafers contain BMDs in a concentration of $5 \times 10^8$ cm$^{-3}$ to $10^{10}$ cm$^{-3}$.

18. The process of claim 1, wherein an epitaxial coating of the p$^-$-doped semiconductor wafers has a thickness of from 1 to 5 μm.

19. The process of claim 18, wherein the epitaxial coating contains boron in a concentration of $2 \times 10^{16}$ cm$^{-3}$ to $1 \times 10^{15}$ cm$^{-3}$.

20. The process of claim 1, wherein an epitaxial coating on the p$^-$-doped semiconductor wafers have less than 40 layer defects of a size larger than 0.09 μm based on the area of a 200 mm wafer.

* * * * *

UNITED STATES PATENT AND TRADEMARK OFFICE
CERTIFICATE OF CORRECTION

| | |
|---|---|
| PATENT NO. | : 7,470,323 B2 |
| APPLICATION NO. | : 11/870565 |
| DATED | : December 30, 2008 |
| INVENTOR(S) | : Wilfried Von Ammon et al. |

It is certified that error appears in the above-identified patent and that said Letters Patent is hereby corrected as shown below:

Column 6, Line 6, Claim 1:

After "$C_O$" insert -- of the crystal --.

Signed and Sealed this

Twenty-fourth Day of February, 2009

JOHN DOLL
*Acting Director of the United States Patent and Trademark Office*